United States Patent [19]

Lee

[11] Patent Number: 5,086,283
[45] Date of Patent: Feb. 4, 1992

[54] DIPOLE TRANSDUCER ARRAY FOR BULK ACOUSTIC WAVE DELAY DEVICE

[75] Inventor: Sheng-Hann Lee, Cupertino, Calif.

[73] Assignee: Teledyne Industries, Inc., Los Angeles, Calif.

[21] Appl. No.: 455,202

[22] Filed: Dec. 22, 1989

[51] Int. Cl.⁵ .................. H03H 9/125; H03H 9/30
[52] U.S. Cl. ..................... 333/149; 310/366
[58] Field of Search ............... 333/141, 142, 149; 310/365, 366

[56] References Cited

U.S. PATENT DOCUMENTS

| | | | |
|---|---|---|---|
| 3,453,711 | 7/1969 | Miller | 310/334 X |
| 3,688,222 | 5/1972 | Lieberman | 333/149 |
| 3,893,048 | 7/1975 | Lieberman | 333/141 |
| 3,946,341 | 3/1976 | Chiron et al. | 333/141 |
| 4,016,515 | 4/1977 | Wauk, II | 333/149 |
| 4,488,128 | 12/1984 | Odozynski | 333/142 |

FOREIGN PATENT DOCUMENTS

| | | | |
|---|---|---|---|
| 283074 | 11/1989 | Japan | 310/366 |
| 1507458 | 4/1978 | United Kingdom | 333/141 |

OTHER PUBLICATIONS

1974 IEEE International Solid State Circuits Conference, Lieberman et al., pp. 100-101, 235.
1979 Ultrasonic Symposium, IEEE, Sundelin et al., pp. 161-164.
1980 Ultrasonic Symposium, Moore et al., pp. 838-841.
IEEE Transactions on Microwave Theory and Techniques, No. 11, Nov. 1969, Reeder et al., pp. 927-941.

Primary Examiner—Eugene R. LaRoche
Assistant Examiner—Benny Lee
Attorney, Agent, or Firm—Skjerven, Morrill, MacPherson, Franklin & Friel

[57] ABSTRACT

An acoustic delay line device for microwave equipment includes a cylindrical acoustic substrate. A transducer array including four transducers located at the corners of a square is formed on each end of the cylinder. The four transducers are electrically connected in series top-to-top and bottom-to-bottom so that adjacent transducers are of opposite polarity and dipoles are formed diagonally. The first and last transducer in the series are connected electrically to the outside source of receiver of RF signals by bonding pads which are offset from the transducers, and by connection wires bonded to the bonding pads. A ground plane area is provided on both ends of the acoustic substrate surrounding each transducer array.

7 Claims, 11 Drawing Sheets

DIPOLE TRANSDUCER ARRAY FOR BULK ACOUSTIC WAVE DELAY DEVICE

BACKGROUND OF THE INVENTION

1. Field of the Invention

This invention relates to a transducer for microwave propagation. More specifically, the invention relates to several transducers electrically connected in series to form an array for an acoustic delay device.

2. Description Of The Prior Art

In the field of microwave technology, bulk mode acoustic delay lines are well known. Bulk acoustic delay lines provide radio frequency memory for periods from submicrosecond to several microseconds. These bulk acoustic delay lines (see FIG. 1) are typically a body 10 formed of a crystal material such as quartz or sapphire. At opposing parallel surfaces 12, 14 of the body piezoelectric transducers 16, 18 are formed. An electrical signal is provided to transducer 16 at one surface 12 of the crystal body 10. Transducer 16 then generates an acoustic compression wave in the crystal body 10 which travels through the body 10. When the compression wave reaches opposing surface 14 of crystal body 10 it causes the second piezoelectric transducer 18 at that end 16 to vibrate mechanically thus generating a corresponding electric signal in transducer 18. Thus the propagation of the acoustic compression wave through a crystal material provides a significantly slower time of propagation than would the radio frequency electrical signal propagating an equivalent distance. A radio frequency electrical signal is thereby converted to a mechanical wave which is then converted back to an electrical signal, providing the delay effect. These delay lines are typically used in microwave applications such as radar and microwave communications. These devices are well known in the art and various modifications are also well known.

The desirable characteristics for a transducer include low conversion loss together with large bandwidth. Typical prior art devices typically include a compromise based on selection of materials and the required conversion loss and bandwidth. Conversion loss is defined as the one way conversion of electric to acoustic power or vice versa. In the typical case when two transducers are assembled at opposite ends of an acoustic substrate to form a delay line, the total loss for the configuration is the sum of the transducer conversion losses plus any loss due to propagation through the acoustic substrate which includes the diffraction loss as well as the material loss.

FIG. 2 shows a typical frequency response of a typical prior art delay line over a range of 2 gigahertz to 6 gigahertz along the horizontal axis with the signal strength shown in dB along the vertical axis. As shown, in the 2 gigahertz to 6 gigahertz range, there is a wide range of frequency response with a strong central peak. This response is undesirable in that this particular device provides a weak signal at the high and low portions of the frequency spectrum.

This is because typically just one transducer element is incorporated at each end of the crystal body. The trade-off has to be made between the conversion loss, which favors a smaller aperture, at the transmitting and receiving transducers, and the diffraction loss in the crystal body which favors a larger aperture Additionally, the problems with these known delay lines are exacerbated where the electrical signals are over a bandwidth rather than at one frequency as the transducer's high Q-factor becomes the dominant factor in conversion loss. In many microwave applications, it is necessary to deal with a range of frequencies. This is especially true in the case of radar warning systems which receive a variety of different frequencies in order to detect various threats.

As a remedy, it is well known to electrically connect several transducers in series. This allows a larger individual transducer aperture while maintaining the same overall impedance. In the prior art the series connection requires the use of air bridges to connect the various transducers. Both the air bridges and transducers are formed by complex semiconductor processing methods. In doing so, the individual cell's diffraction loss is reduced although the conversion loss remains relatively the same. However, one very important aspect neglected here is with the provision of several transducers connected in series, the transducer array produces null spots due to the interference of the different transducers at various distances from the transducer.

The result is a beam pattern that can be completely lost if either a row or a column or both of the arrays have an even number of transducers, which is the structure disclosed in U.S. Pat. No. 3,688,222 issued Aug. 29, 1972, to Lieberman. Moreover, if the array has an odd number of transducers in either a row or column, the signal received by each transducer at the opposite end of the acoustic substrate will not be equal. This causes reradiation phenomenon.

FIG. 3 shows such a 2×3 transducer array including transducers $T_{11}, T_{12}, T_{13}, T_{21}, T_{22}, ..., T_{23}$ arranged on one end of an acoustic substrate and electrically connected in series. Also shown are the corresponding beam patterns of radiated acoustical energy into the acoustic substrate along the indicated axes.

FIG. 4a shows a 3×3 transducer array arranged on one end of an acoustic substrate with transducers $T_{11}, T_{13}, T_{21}, T_{22} T_{23}, Y_{31}, T_{32}, T_{33}$, electrically connected in series as shown. Each transducer $T_{11}, T_{12}, T_{13}, T_{21}, T_{22}, T_{23}, T_{31}, T_{32}, T_{33}$, has an equivalent circuit as shown in FIG. 4b of one capacitor C11, :., C33 combined with one resistor $R_{11}, R_{33}$. Since the transducers $T_{11}, T_{12}, T_{13}, T_{21}, T_{22}, T_{23}, T_{31}, T_{32}, T_{33}$ are series connected, the current Imn through any transducer $T_{mn}$ is equal to the current $I_{11}$ through the first transducer $T_{11}$. For the central transducer $T_{22}$ the total current $I_{22} = I_{22}^+ + I_{22}^-$, where $I_{mn}^+$ denotes incident current and $I_{mn}^-$ denotes reflected current. Thus, $I_{22}^+ < I_{mn}^{30}$ for $1 \leq m, n \leq 3$. Therefore $I_{22}^- \leq I_{mn}^-$, and this is the value of the reradiated signal from each transducer, as a result of the non-uniform beam pattern. In other words, the surrounding 8 cells partly become the load for the center cell.

This reradiation phenomenon is a major deficiency of prior art m by n transducer arrays, and this deficiency is not believed to have been disclosed previously.

It is also known in the art to provide on either end of a crystal body 22 a transducer array which as shown in plan view in FIG. 5a is a mosaic consisting of six pie-shaped segments 24-1, 24-2, 24-3, 24-4, 24-5, 24-6 of a circle, with each transducer 24-1, 24-2, 24-3, 24-4, 24-5, 24-6 electrically connected in series to the adjacent transducer by connections 26-1, 26-2, 26-3, 26-4 26-5. This pattern has the advantage of acting as a large point source and thus reducing diffraction loss and eliminating the undesirable null spots.

This mosaic structure still has the disadvantages that achievable bandwidth remains the same as in a single dot transducer and that fabrication of this structure requires use of the aforementioned air bridge connections 26-1, ..., 26-5, which are the electrical connections between adjacent segments. FIG. 5b shows a cross section through line A-A of FIG. 5a. Shown in FIG. 5b is acoustic substrate 22, and air bridge 26-1 connecting transducers 24-1 and 24-2, with air gap 27 under air bridge 26-1. Instead of resting on a solid substrate as is typical of semiconductor fabrication technology, the air bridge 26-1 therefore must have a small empty gap 27 of air underneath it. While electrically this is not a problem, fabrication of such air bridge structures is relatively difficult, resulting in low yield and a very expensive device.

Thus a recurring problem in the development of microwave acoustic delay lines, amplifiers, and related devices is the design of transducers that provide good response and are not too expensive, i.e., difficult to fabricate.

Another problem typically encountered with prior art delay lines is called "triple travel suppression." This means that a signal traveling through the acoustic substrate typically bounces between the end surfaces making an extra round trip through the acoustic substrate and so provides a spurious signal due to reflection inside the transducer. Larger aperture, i.e. larger diameter, transducers typically have more triple travel than do smaller aperture transducers. This is because the diffraction loss can be viewed as an acoustic padding or attenuator.

SUMMARY OF THE INVENTION

In accordance with the invention, an acoustic delay line device is provided which includes an array having an even number of circular transducers arranged radially on one end of an acoustic substrate. In accordance with one embodiment of the invention, four such transducers are arranged radially so as to form the corners of a square. The transducers are connected in series top-to-top and bottom-to-bottom so that adjacent transducers provide an out-of-phase polarity signal. This configuration has the advantages of reducing spurious signal levels, being manufactured by a relatively simple process providing a high yield, and providing a flatter response over a given bandwidth.

BRIEF DESCRIPTION OF THE DRAWINGS

Identical reference numbers in various figures indicate similar or identical structures.

DETAILED DESCRIPTION OF THE INVENTION

Figure 6A:
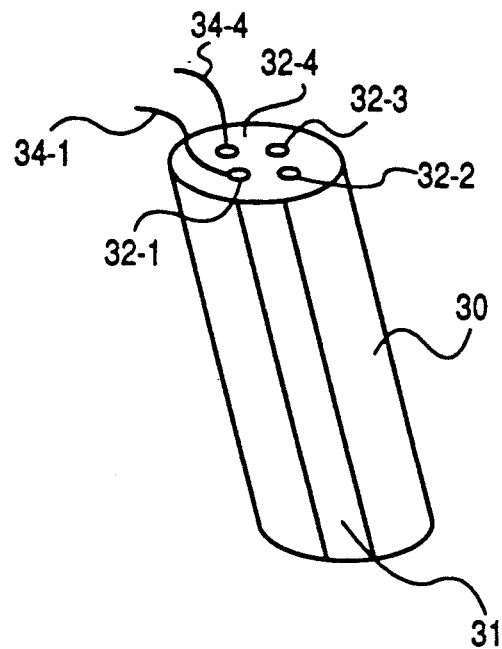
FIGS. 6a and 6b show respectively a perspective view and a top view of one embodiment of the present invention.

In accordance with the present invention a delay line device includes a cylindrical crystal acoustic substrate. An array of transducers is formed on each of the two opposite ends of the cylinder. Each array consists of four transducers which are circular in the plane of the cylinder end, connected in series, and arranged in a square. This arrangement provides an out-of-phase polarity signal and four point sources in each array. As shown in FIG. 6a, acoustic substrate 30 is a conventional crystal material which is typically sapphire or quartz or suitable delay line material and is approximately one inch (2.54 cm) long and is approximately 0.160 inch (4.0 mm) in diameter. In one embodiment, a portion 31 of the side of the cylinder is flat for alignment during fabrication. The exact dimensions of acoustic substrate 30 are a matter of design choice in accordance with the particular application, i.e., the amount of delay time required and the frequencies to be transmitted.

At each end of acoustic substrate 30 four transducers 32-1, 32-2, 32-3, 32-4 are formed. The four corresponding transducers formed on the opposite end of substrate 30 are not visible. The four transducers 32-1, 32-2, 32-3 and 32-4 are electrically connected in series. Two of the transducers, 32-1 and 32-4, which are the first and last transducer in the series connection, are connected to conventional gold wires 34-1, 34-4 which provide the RF signal to the series of transmitting transducers, or if the transducer array is the array at the receiving end of the delay line, take the RF signal out from the transducers. The delay line device is conventionally reciprocal so that it may be used with either end as the receiver or transmitter.

The adjacent transducers such as 32-1 and 32-2 or 32-2 and 32-3 are electrically series connected either top-to-top or bottom-to-bottom, so that the electrical connections between adjacent transducers are formed either on the acoustic material 30 or on the piezoelectric material layer (not shown) which forms the central layer of each transducer. Thus there is no need for air bridges and all the electrical connections between transducers are formed on solid material underlying the connection, and, of course, the piezoelectric layer need not be etched either.

The use of adjacent transducers which are therefore out of phase due to the reversed polarity due to the series connection creates signal cancellation of acoustic waves along a central axis from adjacent transducers.

Figure 6B:
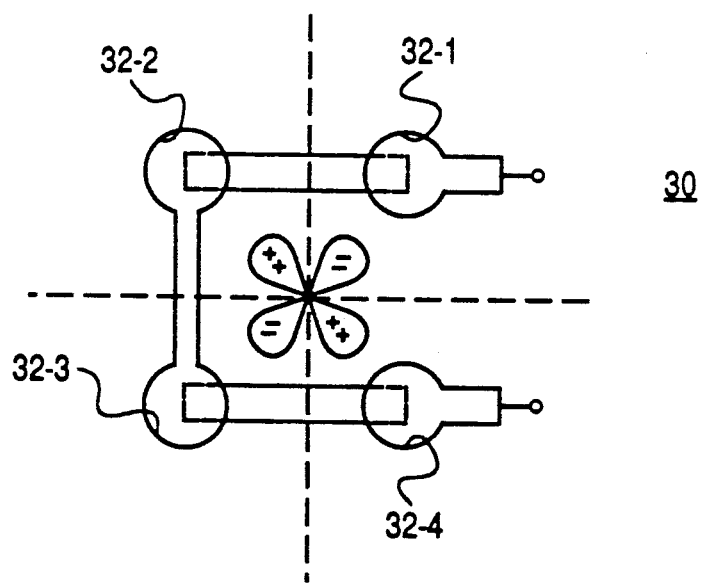

This multiple dipole array structure as shown in a top view in FIG. 6b offers several distinct advantages electrically. Four transducers 32-1, 32-2, 320-3, 32-4 are arranged radially at one end of acoustic substrate 30, and are series connected. The corresponding cross sectional beam pattern is shown along the indicated axes as the beam pattern extends into acoustic substrate 30. The first advantage offered by this structure is improved bandwidth because the angular inclination of the four main lobes of the beam pattern is a monotonic function of frequency. If the main lobes are deliberately pointed at the receiving transducers at high frequency, then low frequency signals will be off target the most. This frequency dependence is therefore a high pass process, and the bandwidth is improved due to this acoustic equalization. Second, triple travel suppression is enhanced for similar (but not identical) reasons. This is because even if the angular inclination is constant for a given frequency, the beamwidth is three times larger for triple-travelled signals and there will be more signal cancellation accordingly. The third advantage is in the radial arrangement of the transducers that eliminates the reradiation problem (described above) with a large transducer array. An advantageous byproduct of no reradiation is reduced triple-travelled signals. Lower insertion loss and higher power handling capability are still retained due to the presence of a plurality of large aperture transducers electrically connected in series.

Figure 1:
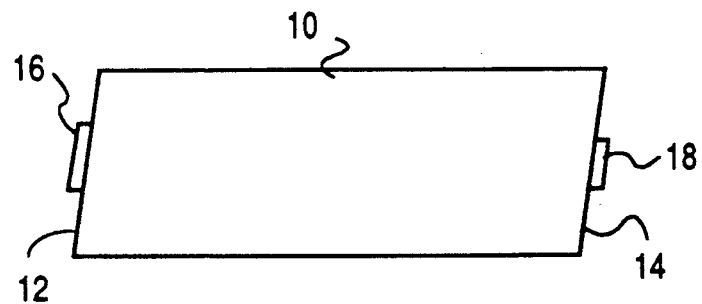
FIG. 1 shows a prior art delay line device.
Figure 5A:
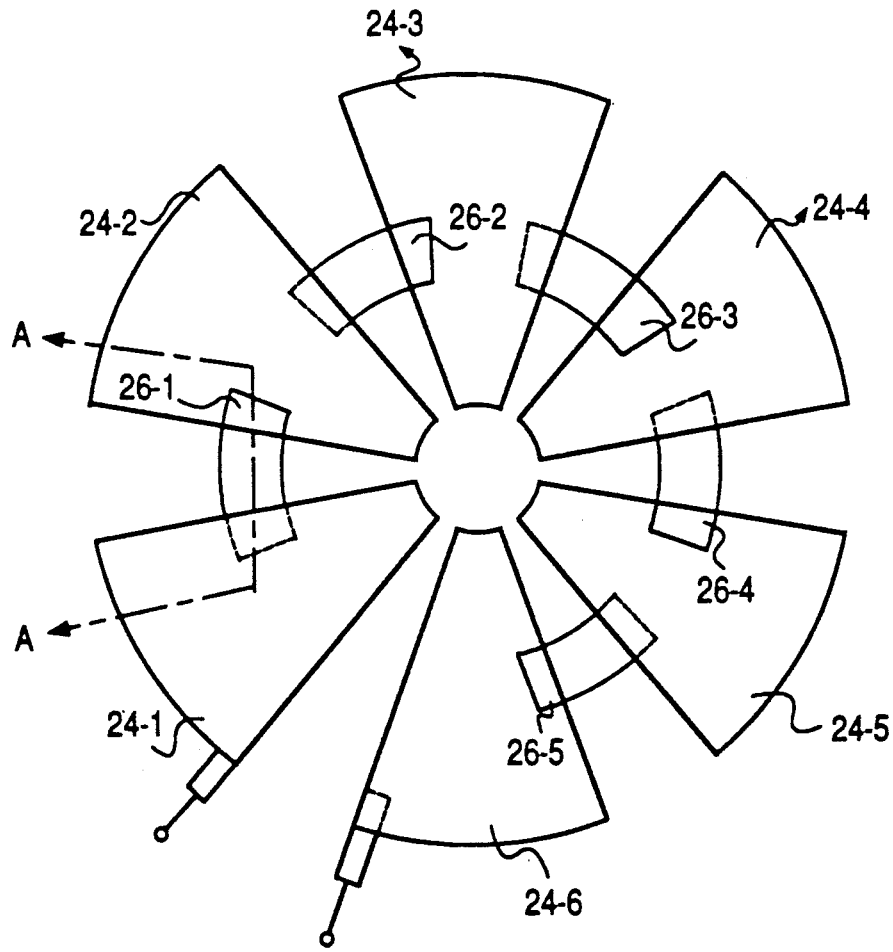
FIGS. 3, 4a, 4b, to 5a, 5b show other prior art transducer arrays.
Figure 2:
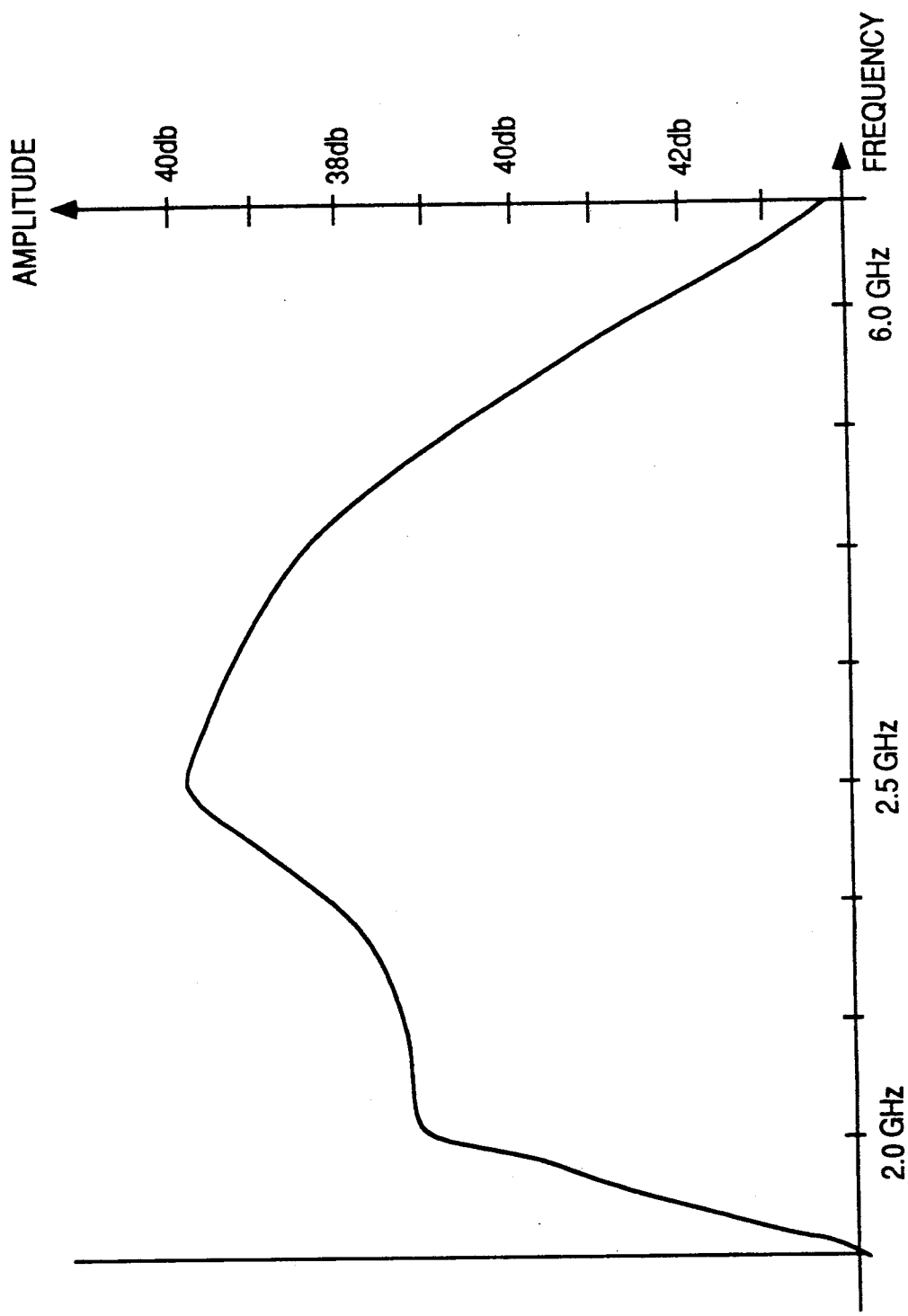
FIG. 2 shows frequency response of a prior art delay line.
Figure 3:
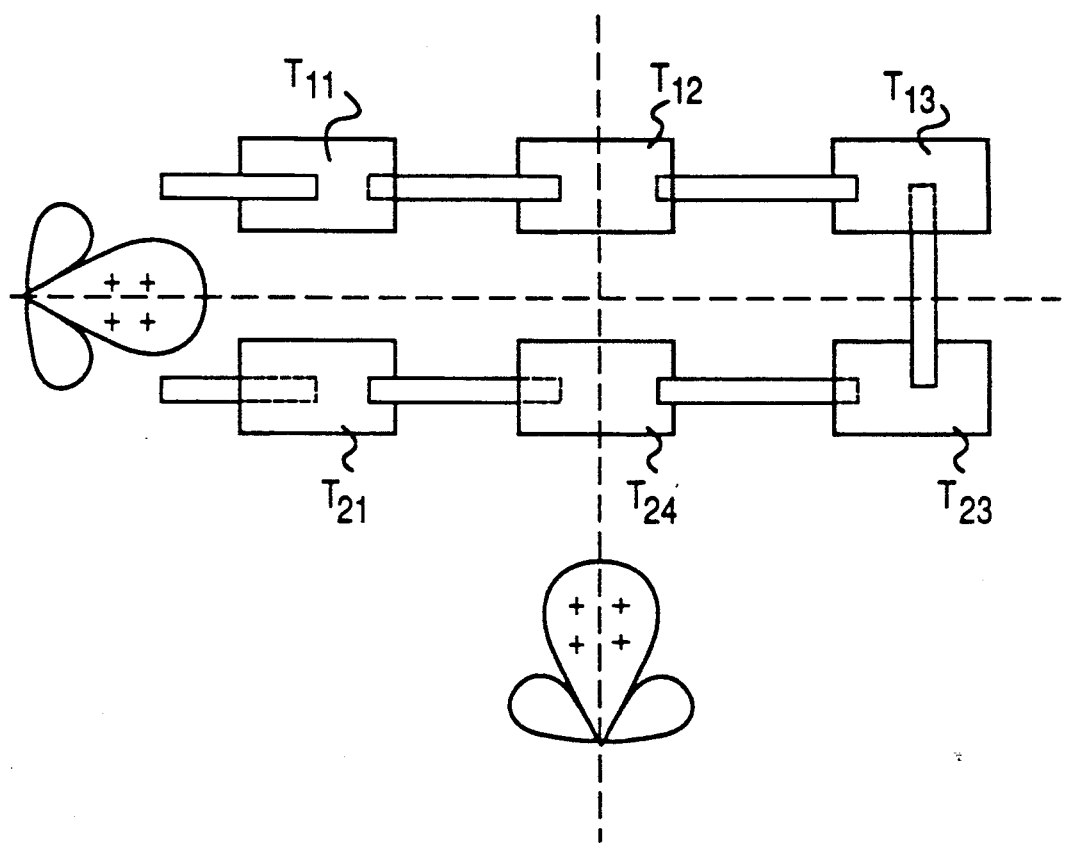
Figure 4A:
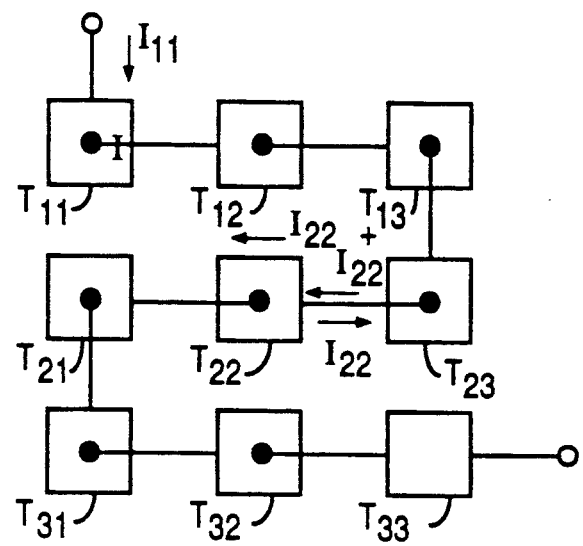
Figure 4B:
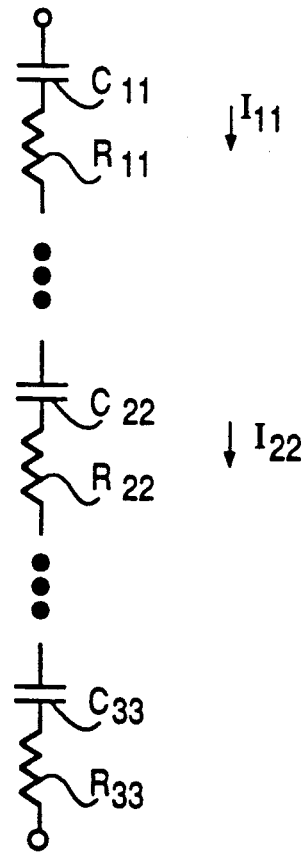
Figure 5B:
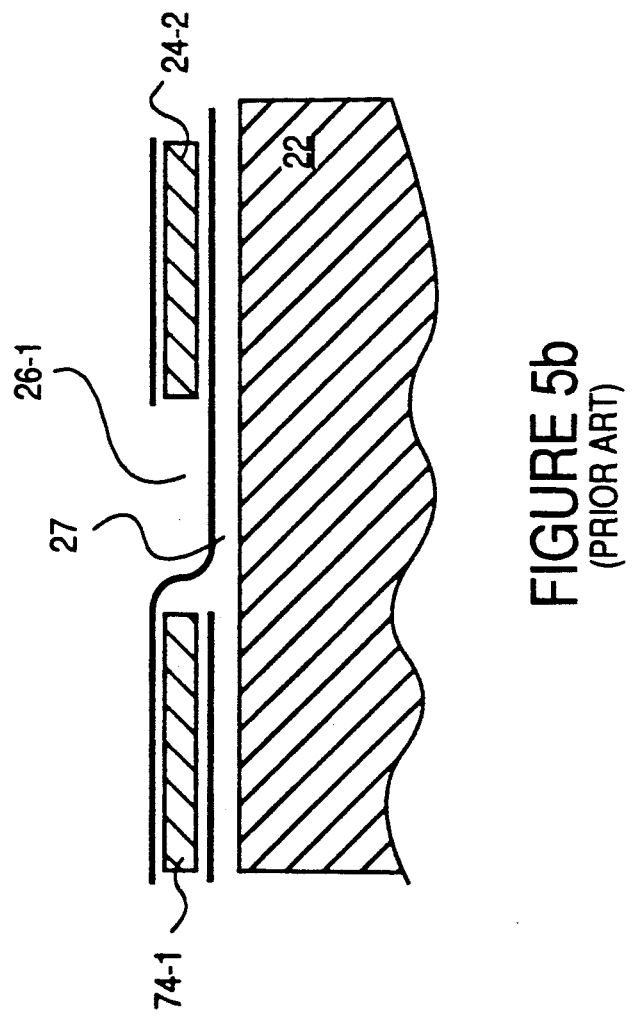
Figure 7:
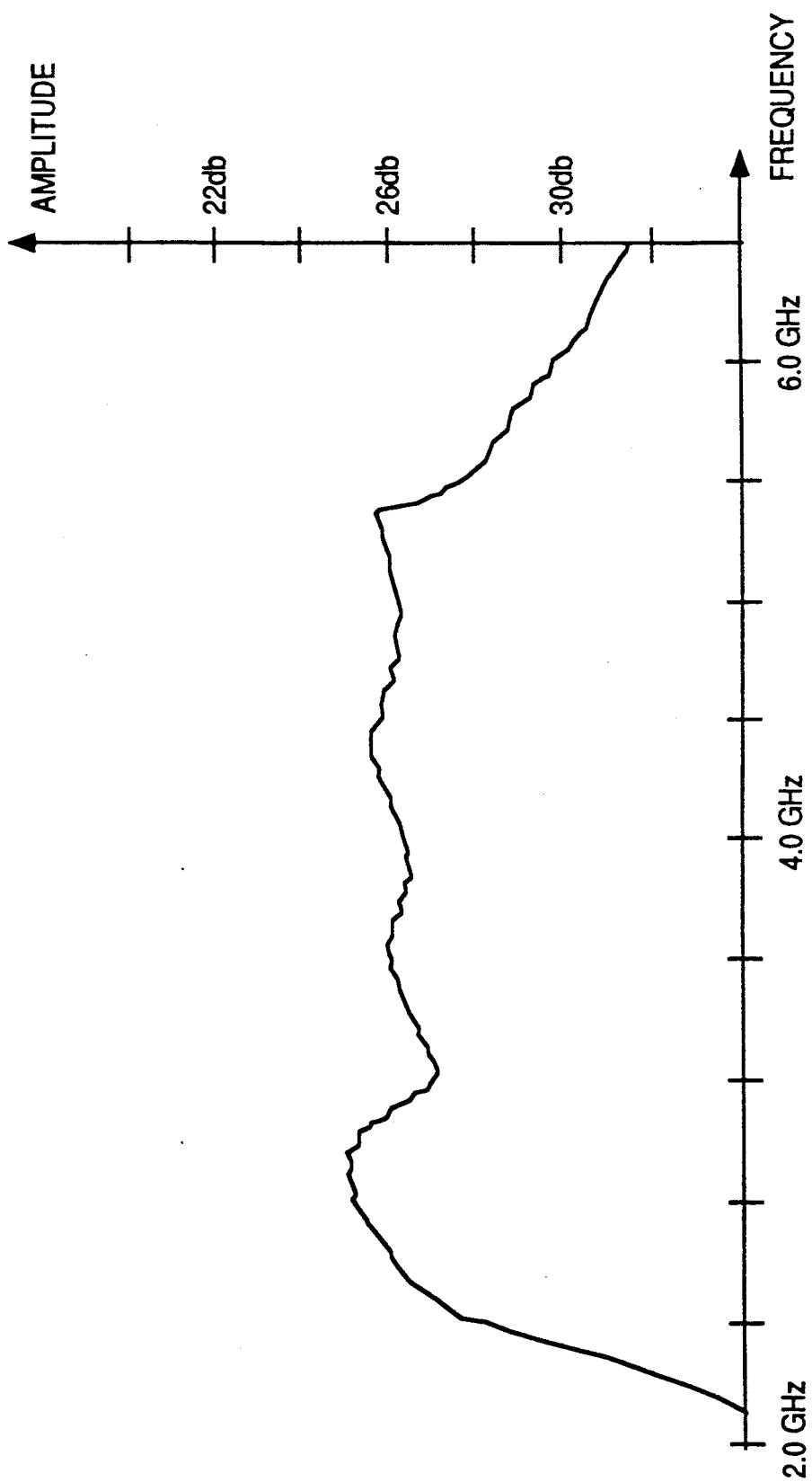
FIG. 7 shows frequency response of one embodiment of the present invention.

FIG. 7 shows the frequency response of one embodiment of the present invention over a bandwidth (as shown on the horizontal axis) of 2 gigahertz to 6 gigahertz with the amplitude of the propagated signal shown in dB along the vertical axis. As shown, in the 2 gigahertz to 6 gigahertz range, the signal strength is desirably relatively flat compared to that of the prior art in FIG. 2.

Figure 8A:
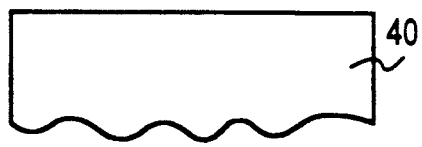
FIGS. 8a through 8f show in cross section fabrication steps in one embodiment of the present invention.

In one embodiment, a delay line device in accordance with the invention is fabricated as follows. One starts with, as shown in FIG. 8a, a conventional sapphire or quartz crystal acoustic substrate 40 which is cylindrical and has the dimensions as described above. In FIG. 8b a layer 42 of chromium approximately 100 Å thick is formed covering one end surface 44 of the acoustic substrate. It is to be understood that in the actual fabrication, both ends of the acoustic substrate 40 nave the transducers formed on them in identical and simultaneous steps. The transducer arrays at either end of the acoustic substrate are precisely aligned with the other end by use of one portion of the side of the cylinder which is conventionally flat rather than rounded (not shown). Only one end of the acoustic substrate is shown and discussed herein for simplicity. Formed over chromium layer 42 is a second layer 46 of gold typically 2750 Å thick Metal layers 42, 46 are both deposited by conventional triode sputtering. Next, in FIG. 8c, by use of a conventional photolithographic masking process, the chromium and gold layers (shown as one layer 46) are masked and most of metal layer 46 is removed.

Figure 8E:
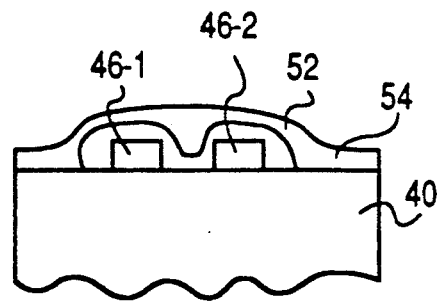
Figure 8B:
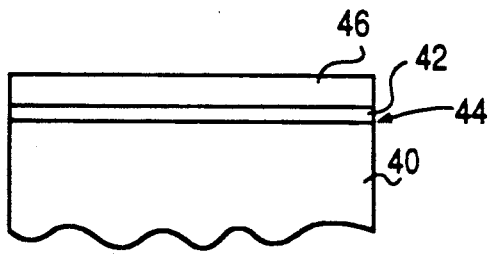
Figure 8F:
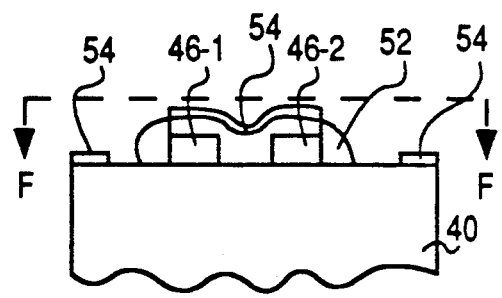
Figure 8C:
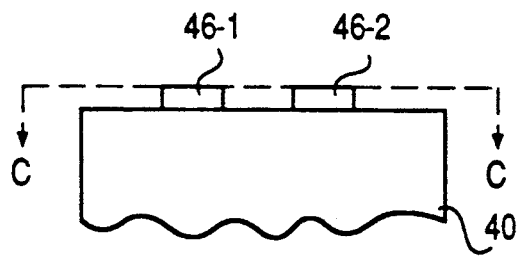
Figure 9A:
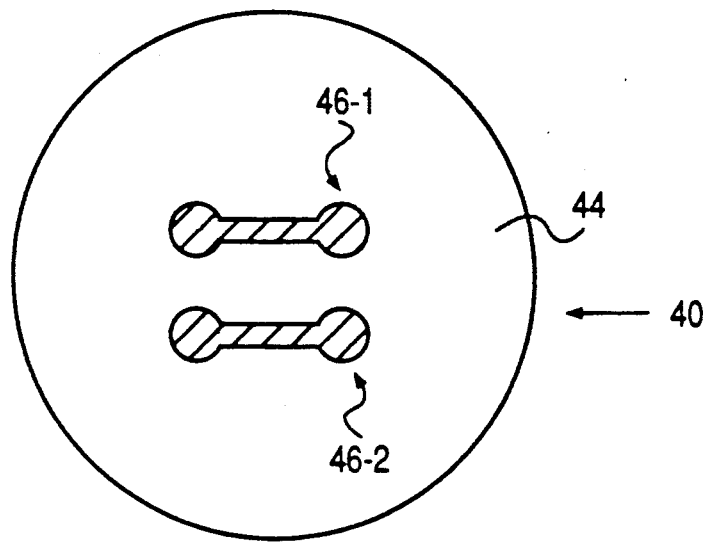
FIGS. 9a and 9b show in top view fabrication steps in one embodiment of the present invention.

The remaining portions of the metal layer 46-1, 46-2 are shown in FIG. 9a in a top view through line C—C of FIG. 8c. Each remaining metal layer structure 46-1, 46-2 consists of a dumbbell-shaped are as shown in FIG. 9a. Each dumbbell-shaped area 46-1, 46-2 includes two dots connected by a bar. The dots are typically 3 or 4 or 5 or 6 mils in diameter. The connecting bars are of somewhat smaller width than the diameter of the dots, as is convenient. Adjacent dots have a spacing of 0.001 inch (0.025 mm) between their edges. The four dots are the lower electrical contacts for four transducers. The four dots are shown centered on the acoustic substrate surface 44 but they need not be centered, and may be in any convenient portion of the acoustic substrate end surface 44. The dot diameter is such that each dot defines a lower contact for a transducer having one-quarter of the total desired impedance of the delay device.

Figure 8D:
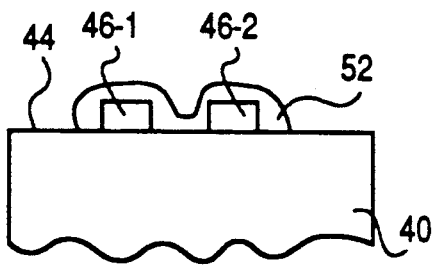

In the next step, shown in FIG. 8d, a layer 52 of zinc oxide approximately 3850 Å thick is sputtered covering the metal areas 46-1, 46-2 and the area immediately surrounding them on the acoustic substrate surface 44. The thickness of zinc oxide layer 52 is approximately one-half the wavelength of approximately the middle of the desired frequency spectrum which is to be transmitted by the delay device. Materials which provide the piezoelectric effect other than zinc oxide may be used in other embodiments of the invention. In the case of a delay device which is to cover a 2 gigahertz to 6 gigahertz spectrum, instead of the exact center, i.e. 4 gigahertz, a slightly higher frequency is selected, such as 5 gigahertz, to compensate for the finite electrode thickness, and thus the desired thickness is that which is equal to the wavelength of light corresponding to 10 gigahertz.

Figure 9B:
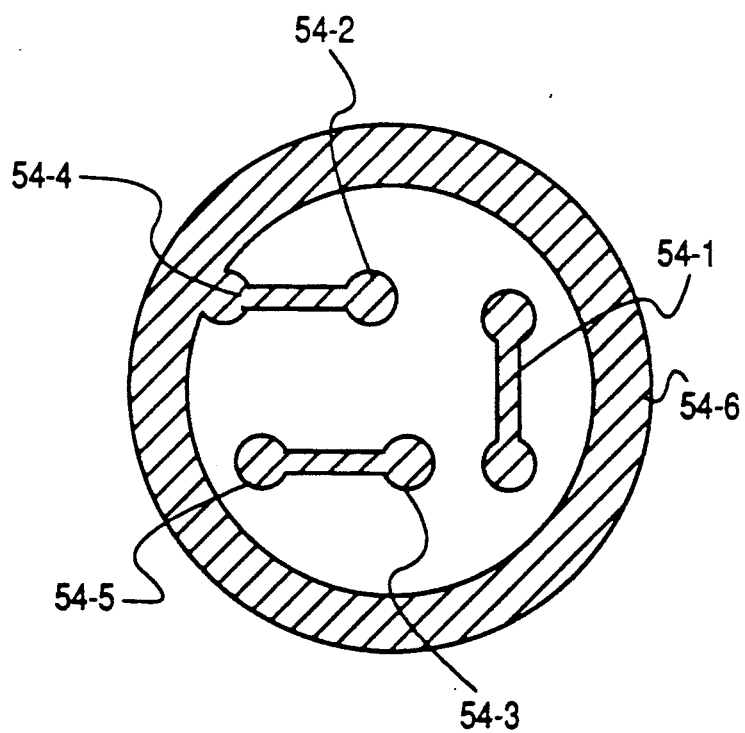

As shown in FIG. 8e, another layer of chromium approximately 100 Å thick is provided over the entire surface and this chromium layer is then overlaid with another layer of gold approximately 1000 Å thick. (These two layers are shown as one metal layer 54.) This second chromium and second gold layer 54 is identical to the first chromium and first gold layers in terms of method of application in one embodiment. In the next step, in FIG. 8f, this second chromium and gold layer 54 is conventionally masked and patterned by photolithographic methods. As shown in FIG. 9b, showing a top level view along line F—F in FIG. 8f, the second mask step provides an electrical upper level connection 54-1 between lower level metal layers 46-1, 46-2 as well as the upper metal contacts 54-2, 54-3 for the other two transducers. This compliments the lower level connection between transducers provided by the bottom layer metal 46-1, 46-2 of FIG. 7a. Preferably the diameter of each of the upper level metal dots is smaller by 0.002 inch (0.050 mm) than that of the lower level dots so as to improve fabrication yield. Thus the four dots on the top layer metallization in one embodiment have a spacing of 0.003 inch (0.076 mm) between edges of adjacent dots.

The dimensions and locations of the dots in the top layer metallization define the effective size and location of each transducer. In one embodiment, so as to obtain better resolution, the upper level metallization layer is formed by a conventional "lift off" method. That is, in FIG. 8e, first a photoresist layer is formed and patterned with a mask. Then the chromium and gold layers are deposited over the patterned resist layer. The resist layer is then dissolved by immersing the structure in an acetone bath which is agitated ultrasonically, removing the resist layer and so lifting off all overlying metal, and leaving the metallization layer as determined by the mask.

In addition, as shown in FIG. 9b, two additional metal dots 54-4, 54-5 are provided electrically connected to areas 54-2 and 54-3 by the top layer metallization. These two additional dots are provided in this embodiment for outside electrical connection (boing). Gold wires (not shown) are then bonded to the dot 54-4 and 54-5. The gold wires which provide the external electrical connection are each about 0.001 inch (0.025 mm) in diameter and about 0.030 inch (0.76 mm) long. The gold wires are bonded to bonding dots 54-4, 54-5 which are offset from the corresponding transducer so as to avoid mechanical stress on the transducers themselves during the bonding process, and also to avoid the gold wire acting as ° n additional acoustical load to the transducers. In another embodiment of the invention, the offset bonding dot- are omitted and the gold wires bonded directly to the transducers' upper metallization layer.

The metallized area 54-6 outside the area of the upper transducer contacts functions as a ground plane. Ground plane area 54-6 is contacted conventionally by a washer in the holder (both not shown) which is conventionally provided to hold the delay line device. As can be seen, the gold wire attached to area 54-4 is not therefore electrically necessary; this gold wire is used instead for shunt resonance tuning for low frequencies and narrow bandwidths, and may be omitted in one embodiment.

The above described embodiment of the invention has more than quadruple the power handling capability of the prior art devices due to the provision of four transducers per array and the larger aperture for each transducer. Typically, a 0.010 inch (0.25 mm) diameter dot size operating at a 1.5 gigahertz frequency will have a power rating of one-half watt power which is conveniently expressed as 27 dBm.

Figure 10:
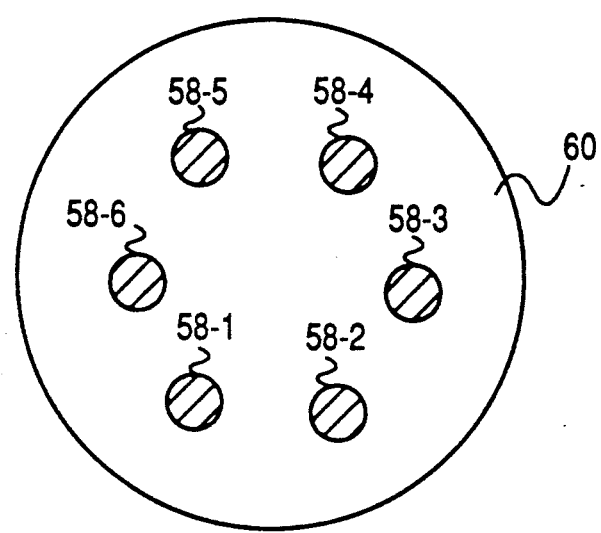
FIGS. 10 and 11a, 11b show other embodiments of the present invention.

In another embodiment of the invention, instead of using just four transducers defined by the two metal layers, six transducers are provided arranged radially in a circle. This embodiment is shown in a top view of one end of a delay line in FIG. 10 including transducers 58-1, 58-2, 58-3, 58-4, 58-5, 58-6 formed on substrate surface 60. (The offset bond dots, connections between transducers, and groundplane area are not shown hereto.) This concentric configuration avoids radiation phenomenon as explained previously. The number of transducers in each circle need not be four or six but may be any convenient even number. The adjacent transducers are spaced equidistant from each other on the concentric circle.

Figure 11A:
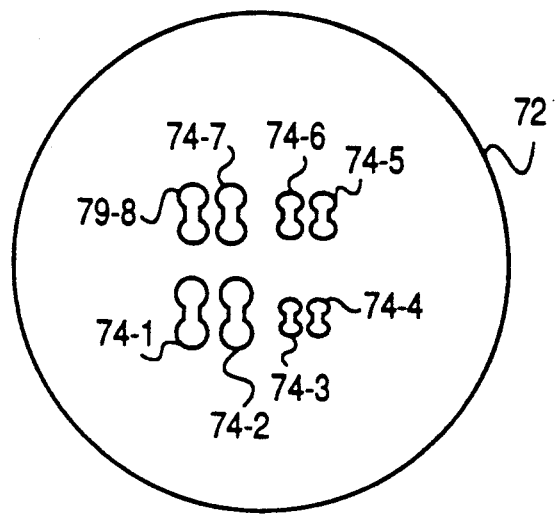
Figure 11B:
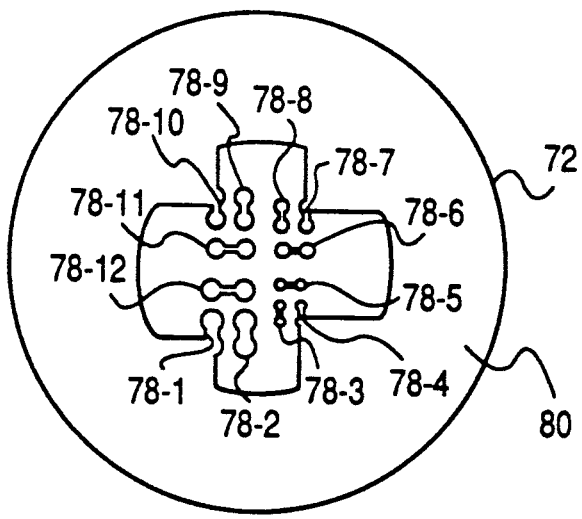

In another embodiment of the invention, as shown in FIG. 11a, the lower level of metallization instead of having four dots, i.e. two dumbbell-shaped structures, includes sixteen dots arranged on substrate surface 72 in eight dumbbell-shaped structures 74-1, 74-2, 74-3, 74-4, 74-5, 74-6, 74-7, 74-8. In this embodiment, each pair (e.g., 74-1, 74-2) of dumbbell-shaped structures is of a slightly different dot size from the other pairs. The dots in the dumbbell-shaped structures are respectively in order of size 3, 4, 5, and 6 mils in diameter. This delay line is fabricated as described above except for the increased number of dots on the lower metallization layer, and a correspondingly increased number of dumbbell-shaped structures 78-1, 78-2, 78-4, 78-5, 78-6, 78-7, 78-8, 78-9, 78-10, 78-11, 78-12 (including the offset bond pads) in the upper metallization layer, as shown in FIG. 11b. This structure provides, instead of just four transducers, sixteen transducers on each end of the substrate. Metallized area 80 is the groundplane area. After fabrication, and after the gold wires (not shown) are bonded to each of the first and last transducers at the bond pads in each set of four transducers, the device is tested and that set of four transducers which performs best for a particular frequency range and delay time is used in the actual application. Therefore this method of fabricating the device increases manufacturing yields by allowing selection at the testing stage of which set of four transducers is to be actually used.

It is to be understood that the above described delay device in accordance with the invention need not be symmetrical in terms of the transducers at either end of the acoustic substrate. That is, different sizes and spacings of the transducer array may be used at either end of the substrate. Also, the invention i° not limited to the materials as described but other materials may be used, for instance aluminum or platinum in place of the gold and/or chromium, and any other suitable piezoelectric material may be used for the piezoelectric layer.

The above description of the invention is illustrative and not limiting. Additional modifications to the invention may be made as will be apparent to one of ordinary skill in the art in light of the above disclosure and the appended claims.

I claim:

1. A delay line device comprising:
    an acoustic substrate having two opposing surfaces; and
    an even number of series-connected circular transducers formed on one of said two opposing surfaces of the acoustic substrate and arranged at approximately equal distances from a central point one the surface.

2. The device of claim 1 wherein there are four circular transducers.

3. The device of claim 1 wherein there are six circular transducers.

4. The device of claim 1, wherein the transducers are connected by connections fully supported by the one surface.

5. The device of claim 1 further comprising:
    two conductive bonding pads on the one of the acoustic substrate surfaces and each bonding pad spaced apart from an associated transducer and electrically connected to said associated transducer by conducive material; and
    an electrical connection to each bonding pad for providing or receiving an electrical signal to or from said associated transducer.

6. A delay line device comprising:
    an acoustic substrate; and
    at least four transducers formed on a surface of the acoustic substrate for transmitting signals in a direction perpendicular to a plane defined by the surface and electrically connected so that each of the transducers is connected in series with an adjacent transducer and so that a polarity of each transducer is opposite to a polarity of each adjacent transducer and each pair of adjacent transducers thereby form a dipole;
    wherein the series connections between each adjacent transducer are fully supported by the surface.

7. A delay line comprising:
    an acoustic substrate, and
    at least four transducers formed on a surface of the acoustic substrate for transmitting signals in a direction perpendicular to a plane defined by the surface and electrically connected so each transducer is in series with an adjacent transducer, and a polarity of each transducer is opposite to a polarity of each adjacent transducer, thereby each pair of adjacent transducers forming a dipolle.

* * * * *

UNITED STATES PATENT AND TRADEMARK OFFICE
CERTIFICATE OF CORRECTION

PATENT NO.   :   5,086,283
DATED        :   February 4, 1992
INVENTOR(S)  :   Sheng-Hann Lee It is certified that error appears in the above-identified patent and that said Letters Patent is hereby corrected as shown below:

Col. 2, line 46, delete "Imn" and insert --$I_{mn}$--.

Col. 2, line 50, before "Thus", insert --$I_{mn}$ refers generally to any location in the circuit). --

Col. 4, line 53, delete "320-3" and insert --32-3--.

Col. 5, line 27, delete "nave" and insert --have--.

Col. 5, line 44, delete "are" and insert --area--.

Col. 6, line 57, delete "on" and insert --an--.

Col. 6, line 59, delete "dot-" and insert --dots--.

Col. 7, line 59, delete "io" and insert --is--.

Col. 8, line 18, Claim 1, delete "one the" and insert --on the one--.

Signed and Sealed this

Third Day of August, 1993

Attest:

MICHAEL K. KIRK

Attesting Officer

Acting Commissioner of Patents and Trademarks